(12) United States Patent
Steglich et al.

(10) Patent No.: US 10,833,056 B2
(45) Date of Patent: Nov. 10, 2020

(54) ELECTROOPTICAL DEVICE

(71) Applicants: IHP GmbH—Innovations for High Performance Microelectronics/Leibniz-Institut fur Innovative Mikroelektronik, Frankfurt (Oder) (DE); Technische Hochschule Wildau, Wildau (DE)

(72) Inventors: Patrick Steglich, Berlin (DE); Andreas Mai, Guben (DE); Christian Mai, Guben (DE); Sigurd Schrader, Berlin (DE)

(73) Assignee: IHP GMBH—INNOVATIONS FOR HIGH PERFORMANCE MICROELECTRONICS/LEIBNIZ-INSTITUT FUR INNOVATIVE MIKROELEKTRONIK, Frankfurt (Oder) (DE)

( * ) Notice: Subject to any disclaimer, the term of this patent is extended or adjusted under 35 U.S.C. 154(b) by 0 days.

(21) Appl. No.: 16/222,301

(22) Filed: Dec. 17, 2018

(65) Prior Publication Data
US 2019/0206850 A1   Jul. 4, 2019

(30) Foreign Application Priority Data

Dec. 29, 2017  (EP) .................................... 17211169
Mar. 16, 2018  (EP) .................................... 18162310

(51) Int. Cl.
*H01L 31/048*  (2014.01)
*H01L 31/18*   (2006.01)
(Continued)

(52) U.S. Cl.
CPC .......... *H01L 25/167* (2013.01); *G02B 6/1225* (2013.01); *G02F 1/025* (2013.01);
(Continued)

(58) Field of Classification Search
CPC ..... H01L 21/56; H01L 23/31; H01L 23/3107; H01L 23/66; H01L 25/167;
(Continued)

(56) References Cited

U.S. PATENT DOCUMENTS 8,081,851 B2   12/2011  Koos et al.
8,131,119 B2*   3/2012  Cunningham .......... G02F 1/025
                                                      385/1
(Continued)

FOREIGN PATENT DOCUMENTS

CN    104 950 478 B    8/2017
DE    102006045102 A1  4/2008
(Continued)

*Primary Examiner* — Stephen W Smoot
(74) *Attorney, Agent, or Firm* — Ware, Fressola, Maguire & Barber LLP

(57) ABSTRACT

The invention relates to an electrooptical device comprising a semiconductor substrate having a front side and a back side, at least one photonic component arranged on the front side of the semiconductor substrate, the photonic component comprising an active layer made of a non-linear optical material, wherein at least one cavity, extends through the semiconductor substrate and connects the active layer on the front side of the semiconductor substrate with the back side of the semiconductor substrate.

16 Claims, 11 Drawing Sheets

(51) Int. Cl.
    *H01L 25/16* (2006.01)
    *G02F 1/035* (2006.01)
    *G02F 1/025* (2006.01)
    *H01L 23/31* (2006.01)
    *G02F 1/361* (2006.01)
    *G02F 1/065* (2006.01)
    *H01L 31/049* (2014.01)
    *G02B 6/122* (2006.01)
    *H01L 25/065* (2006.01)
    *H01L 27/146* (2006.01)
    *H01L 23/66* (2006.01)

(52) U.S. Cl.
    CPC .............. *G02F 1/035* (2013.01); *G02F 1/065* (2013.01); *G02F 1/361* (2013.01); *H01L 23/31* (2013.01); *H01L 23/3107* (2013.01); *H01L 25/0657* (2013.01); *H01L 27/14625* (2013.01); *H01L 31/048* (2013.01); *H01L 31/049* (2014.12); *H01L 31/18* (2013.01); *H01L 23/66* (2013.01); *H01L 2223/6627* (2013.01)

(58) Field of Classification Search
    CPC . H01L 27/14625; H01L 31/04; H01L 31/048; H01L 31/049; H01L 31/18; H01L 31/1804; G02F 1/015; G02F 1/025; G02F 1/035; G02F 1/065; G02F 1/35; G02F 1/361

See application file for complete search history.

(56) References Cited

U.S. PATENT DOCUMENTS

| | | |
|---|---|---|
| 9,256,086 B2 | 2/2016 | Ho et al. |
| 2003/0185108 A1* | 10/2003 | Song .................... G11B 7/1387 369/13.33 |
| 2008/0173879 A1* | 7/2008 | Monaco ................ H01L 25/167 257/84 |
| 2010/0040322 A1 | 2/2010 | Li et al. |
| 2016/0307939 A1* | 10/2016 | Wang .................. H01L 27/1443 |
| 2017/0227798 A1 | 8/2017 | Ishikawa et al. |
| 2018/0267238 A1* | 9/2018 | Wang ...................... G02B 6/136 |
| 2019/0154933 A1* | 5/2019 | Carothers ............ G02B 6/3652 |

FOREIGN PATENT DOCUMENTS

| | | |
|---|---|---|
| WO | 2012/037377 A2 | 3/2012 |
| WO | 2015/171125 A1 | 11/2015 |

* cited by examiner

FIG. 1 -Prior art-

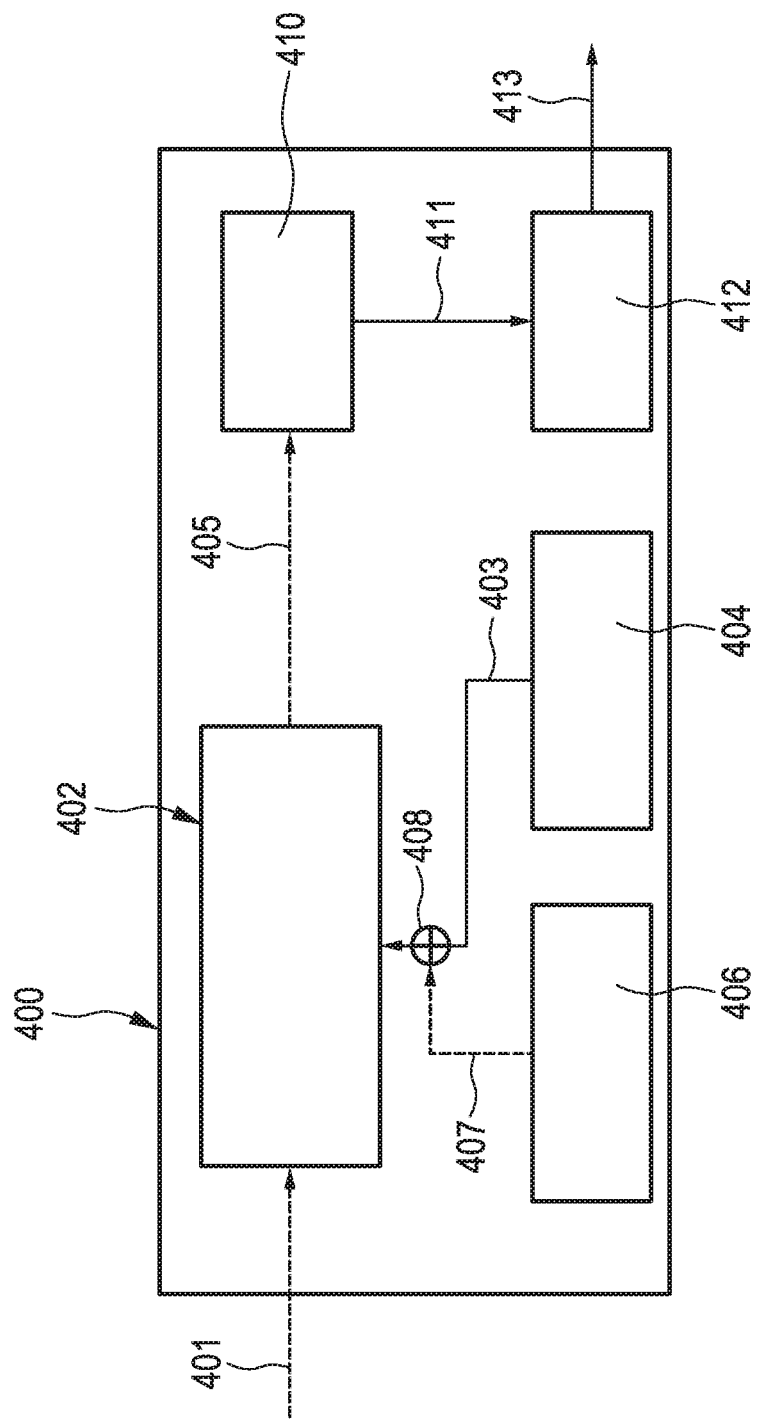

ELECTROOPTICAL DEVICE

CROSS REFERENCE TO RELATED APPLICATIONS

This application claims priority under 35 USC § 119 to European Patent Application No. 17211169.2 filed on Dec. 29, 2017 and European Patent Application No. 18162310.9 filed on Mar. 16, 2018. Both applications are hereby incorporated by reference in their entirety.

TECHNICAL FIELD

The invention relates to an electrooptical device and a method for fabricating an electrooptical device.

BACKGROUND OF THE INVENTION

An electrooptical device in the sense of the present specification is, generally speaking, a device comprising electrical components and photonic components integrated on a semiconductor substrate.

U.S. Pat. No. 8,081,851 B2 describes an electrooptical device comprising electrooptical modulators integrated together with electronic components on a common silicon substrate. A high-index contrast waveguide component is based on a fast changing of transmission properties of an optical waveguide by applying electric voltages, or by embossing electric currents. The waveguide disclosed in U.S. Pat. No. 8,081,851 B2 consists of a high-refractive waveguide core surrounded by a low-refractive surrounding material, which at least area by area has electrooptical properties. By applying a voltage to completely or partially optically transparent electrodes, an electric field is generated having a strong overlap with an optical mode being in interaction with it, therefore changing the transmission properties of the waveguide. This way, fast electro-optical modulators with small switching voltages shall be achieved.

Electrooptical modulators such as that disclosed in U.S. Pat. No. 8,081,851 B2 are typically integrated using fabrication methods of micro-electronics, such known from standard CMOS fabrication. However, due to the sensitivity of many known non-linear optical materials to processing conditions in fabrication technologies of micro-electronics, it remains a challenge to integrate such sensitive materials in electrooptical devices. This blocks the road to using attractive non-linear optical materials in electrooptical devices that would for instance allow achieving particularly modulation rates and thereby high bit rates when transmitting data.

SUMMARY OF THE INVENTION

It is an object of the present invention to provide an improved electrooptical device.

According to a first aspect of the invention, an electrooptical device according to claim 1 is provided. According to the first aspect of the invention the electrooptical device comprises
- a semiconductor substrate having a front side and a back side;
- at least one photonic component arranged on the front side of the semiconductor substrate, the photonic component comprising an active layer made of a non-linear optical material; wherein
- at least one cavity extends through the semiconductor substrate and connects the active layer on the front side of the semiconductor substrate with the back side of the semiconductor substrate.

The electrooptical device according to the first aspect of the invention includes a cavity that extends through the semiconductor substrate. The cavity connects at least the active layer that is arranged on the front side of the semiconductor substrate with the back side of the semiconductor substrate.

The device concept of the present invention is based on the recognition that known non-linear optical materials are sensitive to typical processing conditions in fabrication technologies of micro-electronics, including aggressive gaseous atmospheres and high processing temperatures. In particular, this severely limits the possibilities of fabricating microelectronic device structures layer by layer on top of the non-linear optical materials.

The device concept of the present invention allows, by means of providing the described cavity, fabricating the active layer made of a non-linear optical material at any desired time, independent from the constraints of device structure fabrication on the front side of the semiconductor substrate. In particular, given the proposed structure of the electrooptical device, the non-linear optical material can be introduced from the back side after fabrication of microelectronic front side device structures, e.g. by using CMOS processing, which thus avoids exposing the non-linear optical material to aggressive processing conditions. In fact, the inserting of the non-linear optical material into the cavity and, thus, the fabricating of the active layer of the photonic component with the non-linear optical material can be performed at a selected time during the process of device fabrication. In particular, thus, the non-linear optical material is suitably a material that is insertable through the cavity from the back side of the semiconductor substrate to form the active layer.

This way, in the electrooptical device of the present invention, electronic components can also be arranged on the front side above a photonic component, as will be shown below by means of several embodiments.

Eventually, therefore, the proposed device concept allows the use of non-linear optical materials that the prior art does not allow for integration in known device concepts of semiconductor photonics, including for instance complex device structures with integrated photonic, electrooptical, optoelectronic and electronic components on different levels.

In the following, embodiments of the electrooptical device of the first aspect of the invention will be described.

As mentioned, the photonic component comprises an active layer made of a non-linear optical material. In preferred embodiments, the non-linear optical material is an organic material. Certain organic materials also exhibit electrooptical properties that allow manipulating phase and amplitude independently from each other. Compared to silicon-based optical modulators organic materials exhibit a higher modulation rate and a smaller electric bandwidth, and thereby allow achieving particularly high bit rates when transmitting data. A particularly high robustness is achieved by using organic materials due to the fact that applying an electric field is sufficient to change the refractive index without inducing charge carrier transport. Consequently, no dissipation of electrical energy in form of heat energy occurs which is the main reason for the high energy consumption of current data transmission systems.

However, use of an inorganic material (other than silicon) as the non-linear optical material is also possible within the framework of the device concept of the present invention.

The material selection is limited with respect to fabrication issues only by the requirement that the process step of inserting the non-linear optical material into the cavity during fabrication must not be require processing conditions that could negatively affect the device structures already present at this processing step. This will be discussed in more detail further below in the context of the process aspect of the present invention.

With regard to device applications, it is preferred that the non-linear optical material has an electron system used for the active layer of the photonic component exhibiting a strong spatial electron confinement, which is a property that favours large optical nonlinearities.

In particularly preferred electrooptical devices, the non-linear optical material exhibits an electrooptic effect. In a nutshell, an electrooptic effect can be described as a change in the optical properties of a material in response to an applied electric field present in the non-linear optical material. However, the non-linear optical material of other embodiments is not used for providing an electrooptic effect. Other effects provided by non-linear optical materials, such as wave mixing, second or third harmonic generation, can also be employed in the electrooptical device. Even higher order non-linear optical effects, i.e., of fourth order or higher, can be employed. The term electrooptical device used herein thus does not imply that an electrooptic effect must be used in operation of the device. It only refers to the integration of electronic and optical components in one integrated device on a semiconductor substrate.

Suitable non-linear optical materials that can form the active layer are, e.g., polydiacetylens, preferably in crystallised form, and also preferably aligned with an axis of a one-dimensional conjugated electron system of its polymer chains along the polarisation direction of the electric field vector of the travelling optical wave.

Other non-linear optical materials that can be used are conjugated azo benzene polymers. In principle, also short conjugated oligomers and respective chromophores can also be used, e.g., beta carotene, oligoparaphnylenevinylene, oligocyaninedyes, but also more stable ladder type polymers like oligorylenes or ladder type polyparaphenylene.

In a preferred embodiment, the non-linear optical material is an organic or inorganic material, which exhibits a second- or third-order non-linear optical effect. For instance, the non-linear optical material is a polymer or amorphous carbon/diamond carbon. Also a mixture of a polymer and amorphous carbon in the form of, e.g., carbon flakes can be applied.

Another option is to use composite materials which are composed of a transparent dielectric matrix filled with a suitable concentration of one-dimensional conductive or semiconducting nano-domains, which in some variants advantageously also exhibit a spatial confinement of the electron system in the active layer. Some non-linear optical materials of this kind form composites that include isolated quantum dots. Other examples of suitable materials for use in the conductive or semi-conducting nano-domains are gold, silver, tungsten, aluminium, metallic or semiconducting nanowires, also formed of aligned nanodots, which have direct contact to each other.

Matrix materials can be dielectric polymers, glass or various dielectric oxides, e.g., silicon dioxide, or other suitable oxides, e.g., hafnium oxide.

The non-linear optical material can also be made of an inorganic material. Suitable examples are salts like sulfides, phosphates, phosphonates or nitrates. In case of using an inorganic material, a crystallographic axis with the highest linear and hyper-polarizability should be aligned to a sufficient extent with a polarisation direction of the electrical field used for modulating an optical carrier signal by means of an electro-optic modulator.

Further examples for non-linear optical materials are organic-inorganic hybrid-materials such as bisphosponate multilayers formed of organic bisphosphonic acids containing conjugated and/or aromatic and/or heterocyclic moienties which form after reaction with suitable reactants like zirconylchloride or titanylchloride stable multilayer structures with the desired macroscopic property combination.

It should be noted that it is not a requirement in the context of the electrooptical device of the first aspect of the invention that the cavity must be completely filled with the non-linear optical material. While in some embodiments, the cavity is indeed completely filled with the non-linear optical material, other embodiments have the cavity only partially filled with the non-linear optical material. In the latter group of embodiments, a degree of partial filling of the cavity by the non-linear optical material may be chosen with a view to the requirements of the particular application case and may for instance be subject to boundary conditions of the fabrication process. Where sufficiently precise process control is achieved, the non-linear material can be limited to the active layer of the photonic component, and not extend into the cavity at all. It is an advantage of the present invention that such precise fabrication control in providing the non-linear optical material is not a requirement for the fabrication of the photonic component. In case more material is inserted into the cavity than actually required for providing the active layer, no further processing is required to remove such additional material, as long as the volume of the cavity is sufficient to accommodate such additional material.

Preferably, the semiconductor substrate is made of silicon. This opens the possibility to fabricate the electrooptical device using established industrial microelectronics processing techniques.

In a preferred embodiment of the electrooptical device according to the first aspect, an electrooptical device comprises
- the photonic component, which as mentioned is arranged on the front side of the semiconductor substrate, on a photonic device plane at a first distance from the front side of the semiconductor substrate, and
- an interconnect stack, which is arranged on the front side of the semiconductor substrate and which comprises conductor tracks on at least two metal planes at respective levels within the interconnect stack having distances from the front side of the semiconductor substrate that are larger than the first distance.

In other words, the interconnect stack is applied on the front side of the semiconductor substrate and on top of the photonic device plane that comprises the photonic component.

In typical embodiments of the electrooptical device that have such an interconnect stack, the conductor tracks on different ones of the metal planes of the interconnect stack are separated from each other by a respective dielectric material layer, and one or more conductive vias connect at least two of the conductor tracks that are arranged on different ones of the metal planes. However, the internal structure of the interconnect stack can be designed according to the requirements of a given application case. In particular, the number of metal planes can be selected anywhere between 2 and the maximum number allowable under a given processing technology, such as 5 or 7. Also, vias in the interconnect stack are of course not a requirement in every application case, and can thus be omitted where possible.

These embodiments of the electrooptical device of the invention clearly show the advantage of the device concept including the cavity in the semiconductor substrate for many device applications. Whereas known electrooptical devices are limited in allowing structures having more than one metal plane on top of the photonic plane, the present embodiment represents a chip design with a fully developed interconnect stack as usual in the microelectronics industry, i.e., with at least two metal planes. In particular, the chip design disclosed by the present embodiment of an electrooptical device allows arranging electric components above photonic components which cannot be achieved using prior art solutions.

As mentioned, one or more photonic components can be arranged on a photonic device plane in these embodiments. The photonic device plane is located at a first distance from the front side of the semiconductor substrate. In some embodiments, further device planes or material layers are located between the front side of the semiconductor substrate and the photonic device plane. Such planes or material layers are located at a distance from the front side of the semiconductor substrate that is smaller than the first distance at which the photonic device plane is located. In these embodiments, the cavity that extends through the semiconductor substrate also penetrates these additional planes or material layers so as to extend up to the active layer of the respective photonic component.

In another group of these embodiments, the active layer of the photonic component on the photonic plane is covered by a dielectric material that is different from the non-linear optical material and that is arranged at a smaller distance from the semiconductor surface than a lowest level of the metal planes of the interconnect stack and which is traversed by at least one of the conductive vias. This allows to connect a photonic component to a conductor track on a respective metal plane of the interconnect stack by means of the at least one of the conductive vias. Hence, a voltage can be supplied to the photonic component, e.g. to realise an electrooptical component. It is noted that this feature can be used irrespective of the details of the structure of the interconnect structure. For instance, for implementation of this feature it is not necessary to make use of an interconnect stack with at least two metal planes. One metal plane would work as well, even if that is currently not preferred for application. A particular strength of the device concept of the present invention is that the device concept can be applied to existing chip designs without modifying such chip designs. This is due to the fact, that a chip design itself is, in general, not affected by a localised cavity extending through the semiconductor substrate. Thus, the device concept of the present invention is expected to be applicable to a plethora of existing chip designs comprising photonic components.

For further protecting the non-linear optical material during and after fabrication, a particularly preferred embodiment of the electrooptical device comprises a back side encapsulation for sealing the at least one cavity from an ambient atmosphere on the back side of the semiconductor substrate. By sealing the at least one cavity from an ambient atmosphere the long term stability of the non-linear optical material can be increased. In fact, the performance of the active layer in, e.g., an electrooptical modulator is strongly influenced by external influences such as humidity, presence of oxygen, UV light and by the ambient temperature. The back side encapsulation protects the non-linear optical material from these influences. In preferred variants, the backside encapsulation forms a hermetic sealing of the cavity.

The back side encapsulation can for instance be achieved by sealing the cavity with a suitable cover layer, for instance a semiconductor cover layer. The cover layer can be applied locally at the lateral position of the cavity only. Preferably, however, the cover layer extends over the whole back side of the semiconductor substrate. In different variants of this kind, the cover layer is formed by another semiconductor wafer, for instance applied by a wafer-bonding process This process is particularly suited in silicon technology, where a silicon wafer is bonded to the semiconductor substrate, which is also made of silicon. For application in the context of the present invention, a suitable wafer-bonding process has to be selected keeping in mind the processing requirements of the non-linear optical material inserted into the cavity, for instance regarding temperature stability. However, it is also possible to apply the cover layer in the form of a coating of the back side of the semiconductor substrate with another material.

In an embodiment where a non-linear optical material is used that is stable against oxidation, no encapsulation has to be applied to the back side of the semiconductor substrate.

In a preferred embodiment, the photonic component is an electrooptical modulator. Preferably, thus, the non-linear optical material of the active layer of this embodiment exhibits a non-linear optical response to an electrical field applied to the non-linear optical material. In preferred variants of this embodiment, the electrooptical modulator is optically connected to receive an optical carrier signal, for example via a waveguide arranged on the photonic device plane. The electrooptical modulator preferably comprises field electrodes, which are electrically connected, suitably via the interconnect stack, to receive a time-dependent electric modulation input signal from an external or internal modulation signal source and arranged to generate an electrical field in the active layer in dependence on the electric modulation input signal.

The active layer of such electrooptical-modulator embodiments, in accordance with its non-linear optical response, is configured to modulate the optical carrier signal in dependence on the applied electric modulation input signal so as to generate an optical output signal exhibiting an output signal modulation.

In preferred embodiments, the non-linear optical material exhibits the quadratic electrooptical effect (QEOE). The quadratic electrooptical effect (QEOE), also called DC Kerr effect, describes a change in the refractive index of a material that is exposed to an electric field wherein the change in the refractive index is proportional to the square of the change in the applied electric field. The quadratic dependence of the refractive index from an electric field E and thereby from an applied voltage U and the distance s between electrode can be written as $$n(E) \propto E^2 = \frac{U^2}{s^2}$$

As a consequence, an effective use of the QEOE, i.e. refractive index changes of at least $10^{-5}$, up to a voltage of 5V is only possible if the distance between electrodes is small, e.g. between 50 nm and 200 nm.

In some alternative embodiments, the non-linear optical material exhibits only a linear electrooptical effect (LEOE). The LEOE, also called Pockels effect, is a change in the refractive index of a material that is exposed to an electric field, wherein the change in the refractive index is linearly dependent on the change of the applied electric field. A material that exhibits the LEOE lacks inversion symmetry. However, with respect to device applications, the QEOE shows several advantages compared to the LEOE. For example, the LEOE requires a non-centrosymmetrical orientation of active molecules which often includes that the material is heated up to the glass transition temperature. Subsequently, but still at the high temperature, a high electric field of approximately 100 V/µm is applied to align the active molecules and to establish their non-centrosymmetrical orientation.

This poling process is not necessary for the QEOE because no non-centrosymmetrical orientation is required. Further the QEOE is reversible and stable over a broad temperature range, e.g. between 0° C. and 150° C. In contrast, the LEOE becomes weaker with increasing temperatures as the molecules lose their non-centrosymmetrical orientation that was established during the poling process. Hence, the long-term stability of the QEOE is superior to the long-term stability of the LEOE.

Despite the fact that the QEOE is typically one order of magnitude smaller than the LEOE, the QEOE is typically still one order of magnitude larger than the magnitude of change of the refractive index in currently used silicon photonics applications. In many embodiments, the non-linear optical material exhibits a linear electrooptical effect (LEOE) and in addition a quadratic electrooptical effect (QEOE). Further embodiments make use of a non-linear optical material that exhibits both the quadratic electrooptical effect (QEOE) and the linear electrooptical effect (LEOE). An example material exhibiting both effects is amorphous carbon (also known as diamond-like carbon, DLC).

In a preferred embodiment using a non-linear optical material exhibiting the QEOE, the electrooptical device comprises a modulation control input for receiving a DC offset-voltage, and a summing component configured to receive the DC offset-voltage and an electric input signal and to provide the electric modulation input signal as a sum of the DC offset voltage and the electric input signal. The QEOE generally generates an optical output signal with twice the frequency as the time-dependent electric modulation input signal.

However, the dependence of the modulation frequency of the optical output signal on the applied time-dependent electric modulation input signal can be linearized, if the time-dependent electric modulation input signal comprises an appropriate DC offset voltage as a DC component in addition to an AC component formed by an electric input signal. Linearization here means that the modulated optical output signal has the same modulation frequency as the applied time-dependent electric modulation input signal. In one embodiment, this is implemented by using a summing component that receives a DC offset-voltage as the DC component and the electric input signal as the AC component and that provides the electric modulation input signal as a sum of the DC offset voltage and the electric input signal. Given a characteristic of the non-linear optical material that exhibits a parabolic dependence of the refractive index of the non-linear optical material on the applied electric field, the DC offset voltage shifts the operating point of the device to an approximately linear region of the characteristic.

The linearization can be used to allow the electrooptic modulator tuning the amplitude of the optical carrier signal, i.e., its maximum light intensity. The higher the magnitude of the DC offset-voltage the higher the amplitude of the modulated optical carrier signal. Hence, it is possible to provide an electrooptical modulator with a capacity for tuning the amplitude of an optical carrier signal.

The electrooptical modulator is implemented in one particularly advantageous variant as a slot waveguide, comprising the active layer in a slot between two rails that is filled with the non-linear optical material. The rails, e.g., silicon rails, form the field electrodes such that an electric field is present in the active layer between the rails. A received optical carrier signal travels through the slot filled with the non-linear optical material. By changing a control parameter such as a voltage controlling the amplitude of the electric field, the refractive index of the non-linear optical material is altered such that optical carrier signal is affected in a desired manner by a changing refractive index of the non-linear optical material. Thereby, the optical carrier signal is modulated. As known per se, an electrooptic modulator allows modulating at least one of the phase, the frequency, the amplitude or the polarization of the carrier light signal. In a preferred embodiment, the non-linear optical material is arranged between respective inner side faces of field electrodes, which are separated by a distance between 30 nm and 300 nm, more preferably between 50 and 200 nm, and even more preferably between 50 and 150 nm.

By arranging a non-linear optical material between respective inner side faces of field electrodes a slot waveguide is implemented.

Suitably, the voltage amount of the applied electric modulation input signal is smaller than 5V.

In a preferred embodiment the electrooptical device comprises a detector component which is arranged on the photonic device plane and configured to receive the optical output signal from the electrooptical modulator and to provide an electric detector output signal in response thereto.

Preferably, in this embodiment, the interconnect stack comprises an electronic component, which is arranged on one of the metal planes and electrically connected with the detector component. Using the detector, the optical output signal is converted to an electric signal that can be further fed to and further processed by an electronic component that is in some embodiments also comprised in the electrooptical device, but in other embodiments an external component.

The electrooptical modulator according to a previous embodiment can be used in various device applications that form further embodiments.

In one such embodiment, an electrooptical phase shift module comprises
an optical input configured to receive the optical carrier signal;
an electrooptical device that comprises an electrooptical device of the first aspect of the invention in one of its embodiments that form an electrooptical modulator as described hereinabove, which is configured to generate the optical output signal exhibiting an output signal modulation by inducing a phase shift in the optical carrier signal in accordance with the applied time-dependent electric modulation input signal;
an optical output configured to provide the optical output signal.

Thus, when an optical carrier signal enters the electrooptical modulator, a phase shift in the optical carrier signal in accordance with the applied time-dependent electric modulation input signal is induced. Hence, the generated the optical output signal is an optical signal that is modulated in phase.

Further preferred application cases are formed by an optical arrangement comprises the electrooptical phase shift module of the previous embodiment. For example, the electrooptical phase shift module can be provided in a beam path of a Mach-Zehnder interferometer, a Fabry-Perot resonator, or a ring resonator.

According to a second aspect of the invention, a method for fabricating an electrooptical device is provided. The method comprises:
 providing a semiconductor substrate having a front side and a back side;
 fabricating at least one photonic component comprising an active layer made of a non-linear optical material on the front side of the semiconductor substrate;
wherein fabricating the at least one photonic component comprises
 fabricating a cavity starting from the back side of the semiconductor substrate, and extending the cavity at least to the front side of the semiconductor substrate and up to the photonic component; and
 forming the active layer of the photonic component by inserting the non-linear optical material through the cavity from the back side of the semiconductor substrate.

The advantages of the fabricating method of the second aspect correspond to those described in the context of the electrooptical device of the first aspect.

The method is based on the recognition that known non-linear optical materials are sensitive to typical processing conditions in fabrication technologies of microelectronics, including aggressive gaseous atmospheres and high processing temperatures. In particular, this severely limits the possibilities of fabricating microelectronic device structures layer by layer on top of the non-linear optical materials.

In particular, the method of the present invention allows, by means of fabricating the described cavity, fabricating the active layer made of a non-linear optical material at any desired time, independent from the constraints of device structure fabrication on the front side of the semiconductor substrate.

Therefore, the method enables the use of non-linear optical materials that the prior art processing would not allow for integration in processing techniques known for semiconductor photonics.

Using the method of the present invention, electronic components can also be fabricated on the front side above a photonic component, as will be shown below by means of several embodiments.

The method therefore forms a key technology for opening the path to fabrication of complex device structures with integrated photonic, electrooptical, optoelectronic and electronic components arranged on different levels of the metal planes of a respective interconnect stack.

In the following, embodiments of the method of the second aspect will be described.

In particular embodiments, the non-linear optical material is introduced from the back side after fabrication of microelectronic front side device structures, the latter involving, e.g., a fabrication by CMOS processing. These embodiments thus avoid exposing the non-linear optical material to relatively aggressive processing conditions typical for CMOS processing technology.

It is preferred that in the context of fabricating the photonic component, the cavity is fabricated via back side patterning or back side release. In particular, process techniques that can be applied are back-to-front side lithography alignment, deep Si-etch or $SiO_2$ remove, e.g., using anisotropic wet-etching or HF-vapour etch.

Forming the active layer of the photonic component by inserting the non-linear optical material through the cavity from the back side of the semiconductor substrate comprises in some embodiments an insertion of the non-linear optical material into the cavity by a liquid phase deposition technique, like spin coating, dip coating, self-assembly, a Langmuir-Blodgett-Technique, spraying, electro-spraying, inkjet printing or alternative options in particular known in the art for inserting organic materials solved in a liquid. Inorganic materials can be inserted using the abovementioned techniques, too. In this context, self-assembly is understood as a process in which a disordered system of pre-existing components is allowed to form an organized structure or pattern under suitable processing conditions. The formation of an organized structure or pattern is a consequence of local interactions between the pre-existing components. Concerning the formation of the active layer of the photonic component, self-assembling materials advantageously exhibit a pre-orientation, making a poling procedure by applying an external electric field unnecessary.

Other techniques that can be used for inserting organic and inorganic materials are physical or chemical vapour phase deposition.

Another technique than can be applied is vacuum deposition polymerisation in which polymers are formed during the deposition process under vacuum conditions.

Since the non-linear optical material can thus be a polymer, the method of the second aspect offers a route for integrating silicon-organic hybrid (SOH) photonics into the well-established silicon-based chip-technology. SOH photonics deals with the combination of silicon photonics and organic materials. Silicon photonics includes the application of photonic systems which use silicon as an optical medium and, thus, benefits from the highly advanced processing techniques used in CMOS technology. In combination with organic materials comprising an electrooptic effect, the functionality of photonic systems can be tailored and optimized with respect to specific applications such as silicon-hybrid organic modulators.

It is an advantage of the mentioned embodiments of the method of fabricating an electrooptical device that a full integration of SOH modulators into an electrooptical device can be achieved. In particular, it is possible to fabricate an electrooptical device comprising SOH modulators and electric components that can also be arranged above the photonic components. In particular, an electrooptical device with at least one photonic device plane that comprises at least one photonic component and any suitable number of metal planes can be fabricated. In a preferred embodiment of the method, therefore, it further comprises, before fabricating the cavity, fabricating an interconnect stack on the front side of the semiconductor substrate which comprises conductor tracks on at least two metal planes at respective levels within the interconnect stack having distances from the front side of the semiconductor substrate that are larger than a first distance from the front side of the semiconductor substrate, at which the photonic component is arranged.

A preferred variant comprises that after the patterning steps of front-end of line (FEOL) fabrication, the steps of back-end of line (BEOL) preparation are performed. This includes fabricating the interconnect stack on the front side of the semiconductor substrate. Below the interconnect stack, the photonic component is arranged. After BEOL preparation the back side of the photonic component is released by fabricating the cavity. A preferred variant comprises that after BEOL preparation and after fabricating the cavity, the step of polymer insertion is performed.

In preferred embodiments the method further comprises, after inserting the non-linear optical material through the cavity, sealing the at least one cavity from an ambient atmosphere by fabricating a back side encapsulation of the cavity on the back side of the semiconductor substrate. A preferred variant under this embodiment comprises that after inserting the non-linear optical material through the cavity with the non-linear optical material, the non-linear optical material is sealed by fabricating a back side encapsulation that covers at least the cavity on the back side of the semiconductor substrate.

The back side encapsulation can for example be a wafer that is bonded to the back side of the semiconductor substrate.

Preferably, polymer-based bonding techniques that are usually used for temporary wafer bonding techniques are applied. Optionally, also an eutectic bonding technique can be used. Waver-bonding under high vacuum and at temperatures up to 400 ° C. can be sufficient to reach a hermetic sealing of a non-linear optical material. Semiconductors like silicon can be used as a second material for hermetic sealing. In an alternative wafer-bonding process, the second material is a reactive polymer or low-melting phosphate glass which can be used to obtain sufficient hermetic sealing.

As an alternative to wafer-bonding, the back side of a semiconductor substrate can be coated by an encapsulation layer using coating techniques such as physical vapour deposition (PVD), chemical vapour deposition (CVD) or plasma enhanced CVD (PECVD). It is preferred, that the shape of the encapsulation layer does not disturb the optical and electronic performance of the electrooptical device. Preferably, the material of the encapsulation layer is selected for providing resistance against environmental impact such as exposure to UV light, chemicals, oxygen, humidity etc. An example of a suitable material for the encapsulation layer is diamond-like carbon (DLC).

BRIEF DESCRIPTION OF THE DRAWINGS

In the following, further embodiments will be described with reference to the Figures.

In the Figures:

FIG. 5 shows a block diagram of an electrooptical device for modulating an optical carrier signal;

DETAILED DESCRIPTION

Figure 1:
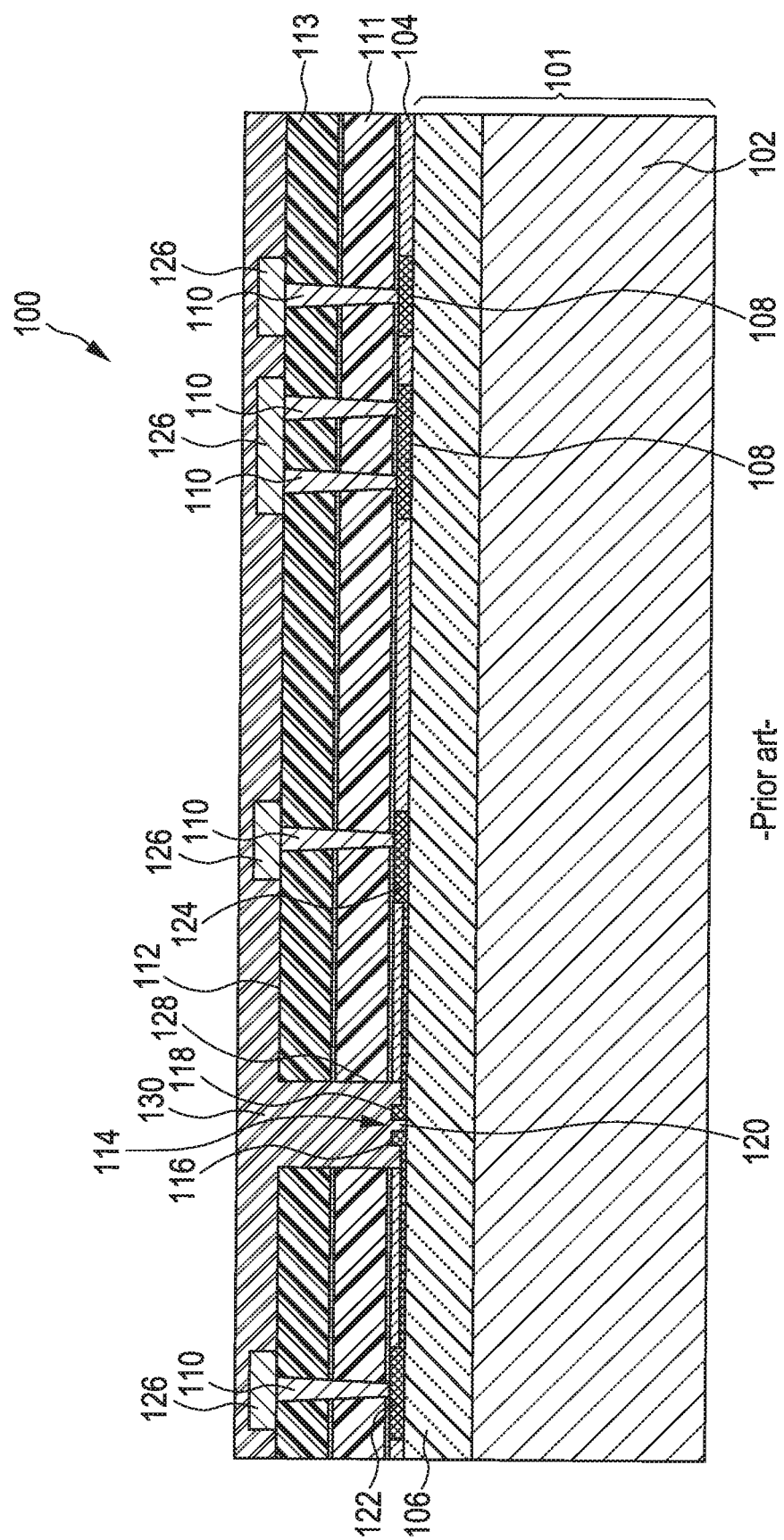
FIG. 1 shows a schematic cross-section of an electrooptical device according to the prior art.

FIG. 1 shows a schematic cross-section of an electrooptical device 100 according to the prior art, which can also be referred to as a silicon-organic hybrid (SOH) component. On a silicon-on-insulator (SOI) substrate 101, comprising a silicon substrate 102 and a buried oxide layer (BOX) 106, photonic devices 108 making use of organic materials are arranged in a photonic device plane 104. The photonic device plane 104 may also comprise optoelectronic components such as a detector (not shown). The photonic devices 108 are connected to metal electrodes 126 by vias 110 that extend through dielectric layers 111 and 113 in a vertical direction, i.e., perpendicular to the photonic device plane 104 towards a front side 112 of the electrooptical device 100.

The electrooptical device 100 further comprises a slot waveguide 114 that consists of two rails 116, 118 which thus define a slot 120 extending between them in lateral directions. Via strip-loads 122, 124 that are connected to the vias 110, each of the rails 116, 118 is connected to a metal electrode 126.

A cavity 128 extends vertically from the front side 112 of the electrooptical device 100 towards the slot-waveguide 114. The cavity 128 is filled with an organic material in the form of a polymer 130 such that the two rails 116, 118 and the slot 120 are coated with the polymer 130. The polymer 130 also covers the complete front side 112 of the electrooptical device 100.

In prior art solutions as shown by way of example in FIG. 1, typical temperature limits for integrating most commonly used organic materials lie around 200° C. Some heterocyclic materials can withstand processing temperatures of up to 300° C. or 400° C. for short periods of time in the range of a few seconds up to several minutes depending on the presence or absence of oxygen during the processing step. As a consequence, in current solutions the integration of organic materials is not compatible with processing techniques used for chip-fabrication, where much higher temperatures are typically used. According to the prior art, the problem of high processing temperatures is circumvented by processing electrooptical devices up to first metal plane only.

Photonic components located below the first metal plane are typically exposed during the processing by applying an etching process with an etching direction from the front side of the electrooptical device towards the substrate. Importantly, no electrical components can be located above the photonic components in this processing technology, because such electronic components would be damaged or destroyed during the etching process. Hence, a major drawback of prior art electrooptical devices is that the number of electric components in the device is limited. As a consequence, in current solutions there exists no compatibility of integrating silicon-organic hybrid (SOH) photonics into established semiconductor-based chip-technology.

That is why in current chip designs electro-optical modulators are integrated in a chip using methods of microelectronics for implementing waveguides for light made of Si. Disadvantages of this solution are a limited modulation speed and comparatively high optical losses which originate from charge carrier transport in Si.

Figure 2:
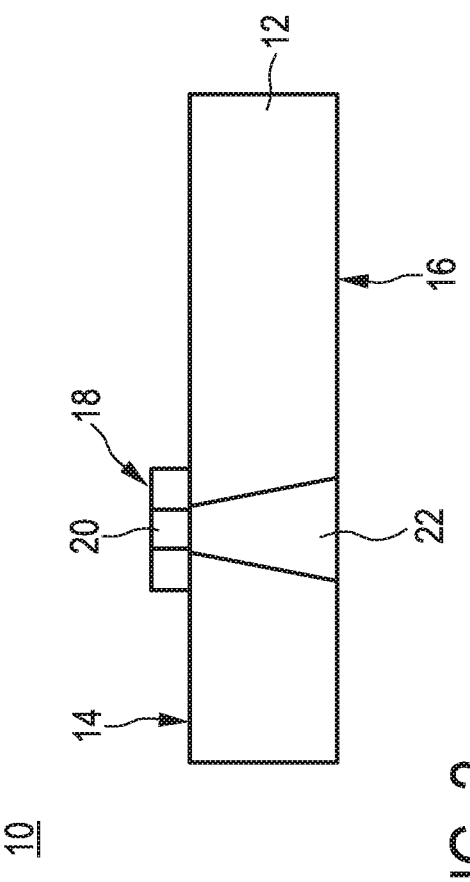
FIG. 2 shows a schematic cross-section of an electrooptical device according to the first aspect of the invention.

FIG. 2 shows a schematic cross-section of an embodiment of an electrooptical device 10 according to the first aspect of the invention. The electrooptical device 10 comprises a semiconductor substrate 12 having a front side 14 and a back side 16. At least one photonic component 18 is arranged on the front side 14 of the semiconductor substrate 12. The photonic component 18 comprises an active layer 20 made of a non-linear optical material. A cavity 22 extends through the semiconductor substrate 12 and connects the active layer 20 on the front side 14 of the semiconductor substrate 12 with the back side 16 of the semiconductor substrate 12.

By means of providing the cavity 22, it is possible to fabricate the active layer 20 made of a non-linear optical material at any suitable processing step after the cavity has been fabricated, independent from the constraints of device structure fabrication on the front side 14 of the semiconductor substrate 12. For example, the non-linear optical material can be introduced from the back side 16 through the cavity 22 after fabrication of microelectronic front side device structures which thus avoids exposing the non-linear optical material to aggressive processing conditions. In particular, thus, the non-linear optical material is suitably a material that is insertable through the cavity from the back side of the semiconductor substrate to form the active layer. The material can be selected to comply with one of the following insertion techniques: a gas phase deposition technique, liquid phase deposition technique, spin coating, dip coating, physical vapour deposition (PVD), plasma enhanced CVD (PECVD), chemical vapour deposition (CVD), atomic layer deposition (ALD), metal organic chemical vapour deposition (MOCVD), self-assembly, Langmuir-Blodgett-Technique, spraying, electro-spray, ink-jet printing, or alternative techniques known in the art, in particular for employing soluble organic or inorganic non-linear optical materials. The possibility of selecting a suitable phase of processing for fabricating the active layer 20 allows using non-linear optical materials that would suffer damage when exposed to typical processing conditions of standard micro-electronics processing, including aggressive gaseous atmospheres and high processing temperatures. This way, the electrooptical device 10 can achieve superior non-linear optical properties.

Figure 3:
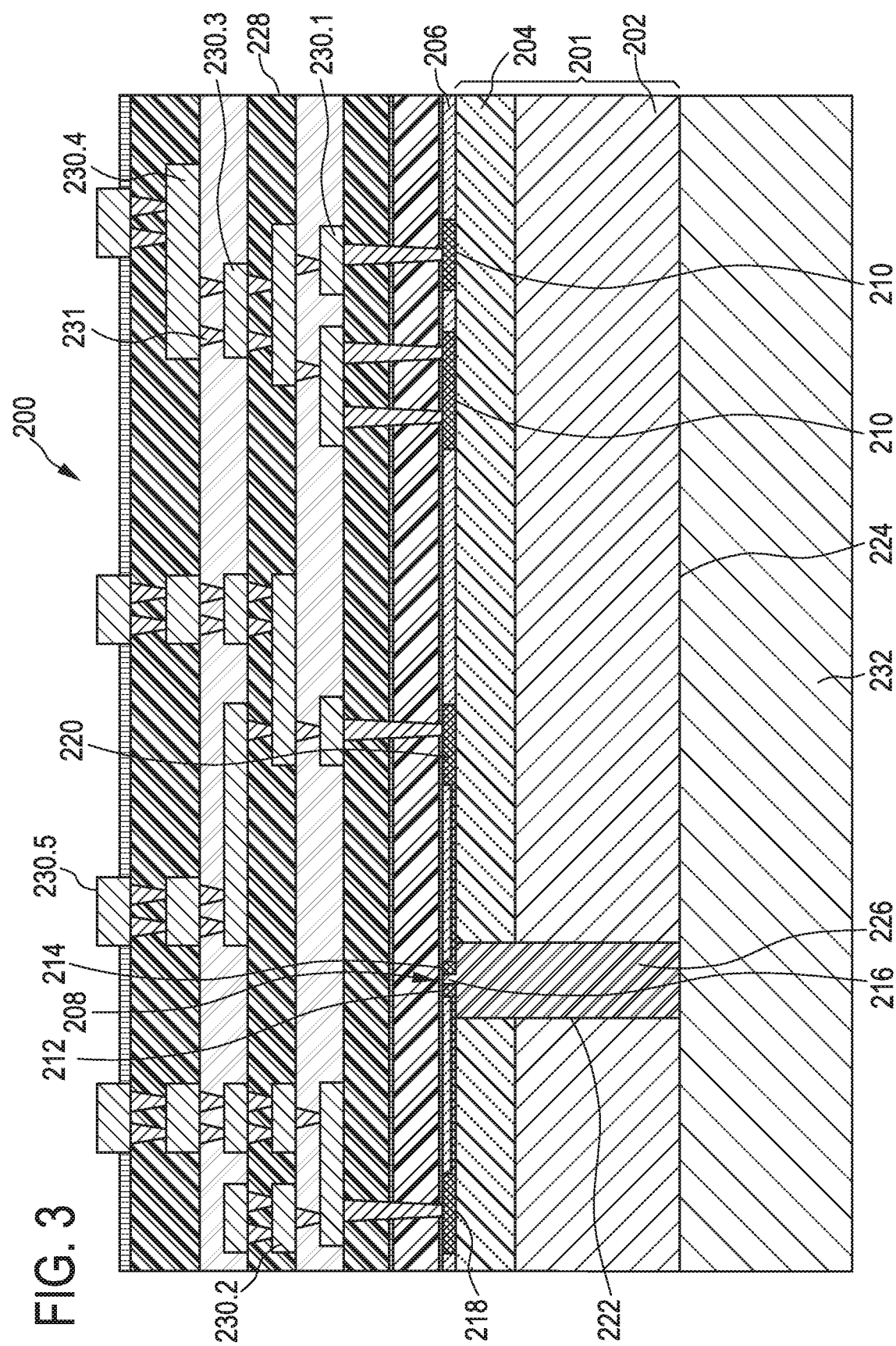
FIG. 3 shows a schematic cross-section of an electrooptical device according to a preferred embodiment of the invention.

FIG. 3 shows an electrooptical device 200 according to a preferred embodiment. On a silicon-on-insulator (SOI) substrate 201 comprising a silicon substrate 202 and a buried oxide layer (BOX) 204, and in a photonic device plane 206, a slot waveguide 208 and further electronic or photonic components 210 are arranged. The slot waveguide 208 comprises two rails 212 and 214 that form a slot 216 between them. Each of the rails 212, 214 is connected to a strip-load 218, 220.

In contrast to the prior art solution of FIG. 1, a cavity 222 is formed in the SOI-substrate 201 and extends from the back side 224 of the SOI-substrate 201 to the back side of the slot-waveguide 208, such that the cavity 222 extends up to a backside of the rails 212, 214 and into the slot 216. The cavity 222 and the slot 216 are filled with a non-linear optical material 226 that in the present embodiment is an organic material. As a consequence, an active layer fills the slot 216 formed by the space extending laterally between the two rails 212, 216.

In the embodiment shown, the interconnect stack 228 comprises conductor tracts on five metal planes. Exemplary conductor tracts on each metal plane are shown under the labels 230.1 to 230.5, thus representing the different metal planes. The conductor tracts are connected by a number of vias for transmitting electric signals. An exemplary via is shown under the reference label 231 and connects the conductor tracts 230.3 and 230.4 on the third and fourth metal planes with each other.

Moreover, electrodes 218 and 220 are arranged on the photonic device plane 206 and connected to vias that in operation of the electrooptical device provide a time-dependent electric modulation input signal to the rails 212, 214 of the slot-waveguide 208 via strip loads of slightly lower thickness than the electrodes. This way, an electrical field of a time-dependence corresponding to that of the electric modulation input signal is generated in the active layer.

The back side 224 of the semiconductor substrate 202 is sealed by an encapsulation layer 232. In the embodiment shown, the back side encapsulation 232 is a silicon wafer that is bonded to the back side 202 of the semiconductor substrate 202 be means of a wafer-bonding process. As a result of the back side encapsulation, the cavity 222 is sealed and, thus, the non-linear optical material 226 in the cavity 222 is protected from an ambient atmosphere. This increases the long-term stability of the electrooptical device 200 and thus results in an improved performance.

FIG. 4A-4F show a processing sequence of a method for fabricating an electrooptical device according to the invention.

Figure 4A:
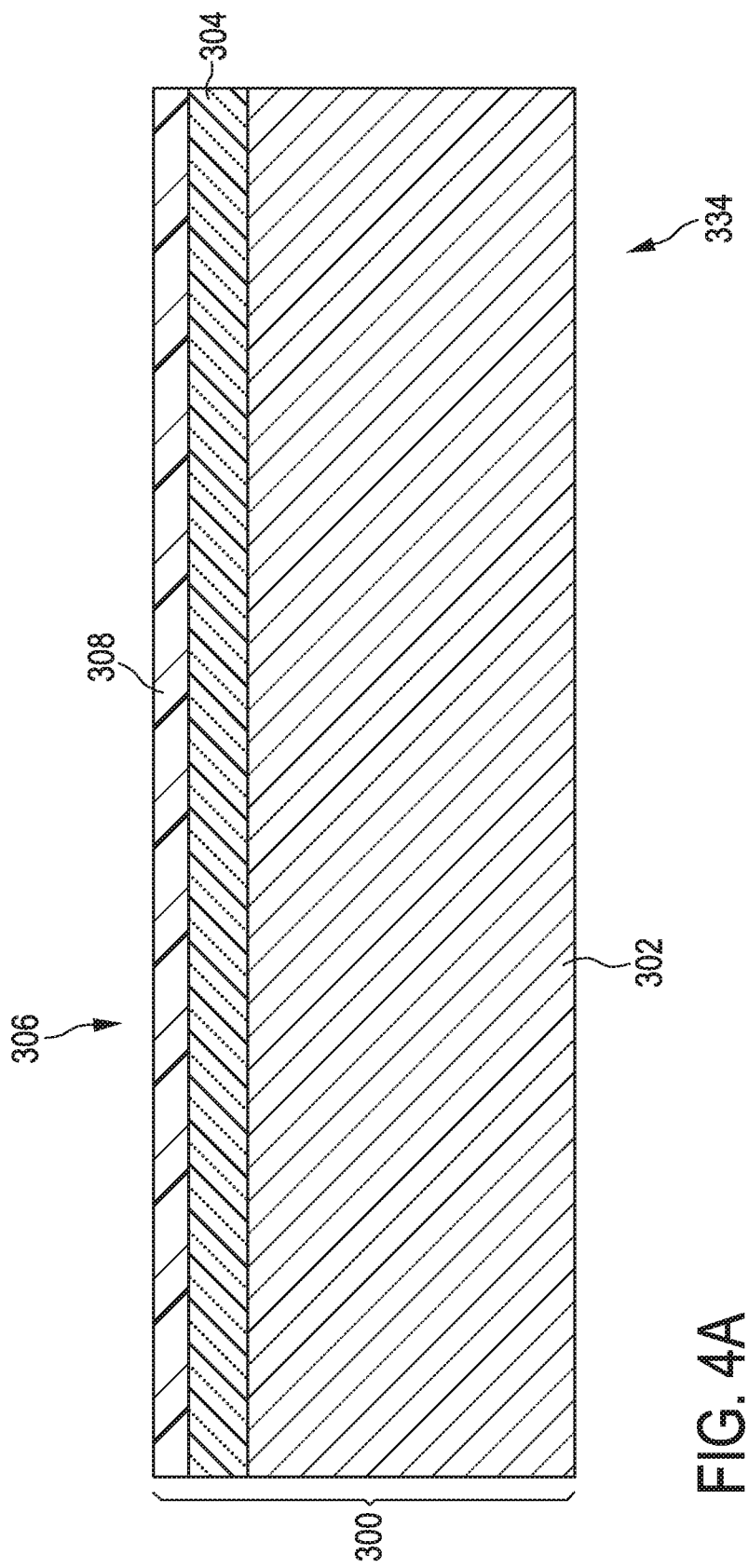
FIG. 4A-4F show a processing sequence of a method for fabricating an electrooptical device according to the invention.

FIG. 4A displays a silicon-on-insulator substrate 300 which is a preferred design of the semiconductor substrate. The silicon-on-insulator substrate 300 comprises a silicon layer 302 and an insulating layer 304 that is arranged on top of the silicon 302. The insulating layer 304 can, e.g., be made of $SiO_2$. A top side of SOI substrate is labelled by the reference label 306, and the back side by the reference label 334. On top of the insulating layer 304, i.e., on the front side 306 of the SOI substrate 300, there is a top silicon layer 308.

Figure 4B:
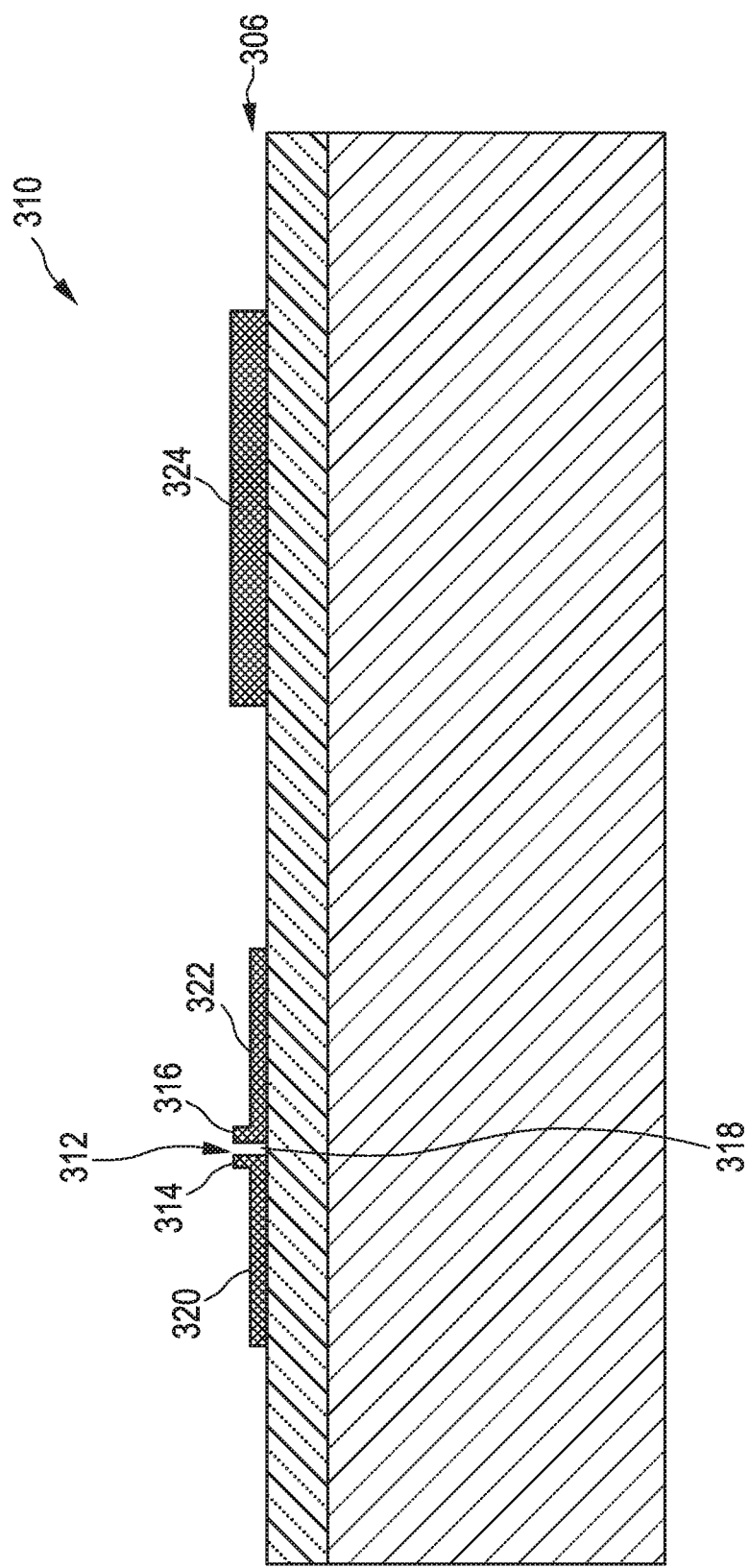

In a later processing step, the result of which is shown in FIG. 4B, front-end-of-line (FEOL) preparation of the electrooptical device 310 is performed, in particular by patterning the top silicon layer 308, by using a lithography technique which as such is known in the art. In this processing step, therefore, electronic and photonic components are fabricated. In particular, a slot waveguide 312 made of silicon is fabricated. The slot waveguide 312 has two silicon rails 314 and 316 separated by a lateral distance defined during the pattering process, thus forming the slot 318 between them. Each of the rails 314, 316 continues into a strip load 320, 322 which serves for electrically contacting the silicon rails 314 and 316. Beside the silicon slot waveguide 312, further components are arranged on the photonic device plane 306, shown by way of example by an electronic component 324 that is represented only schematically in FIG. 4B.

Figure 4C:
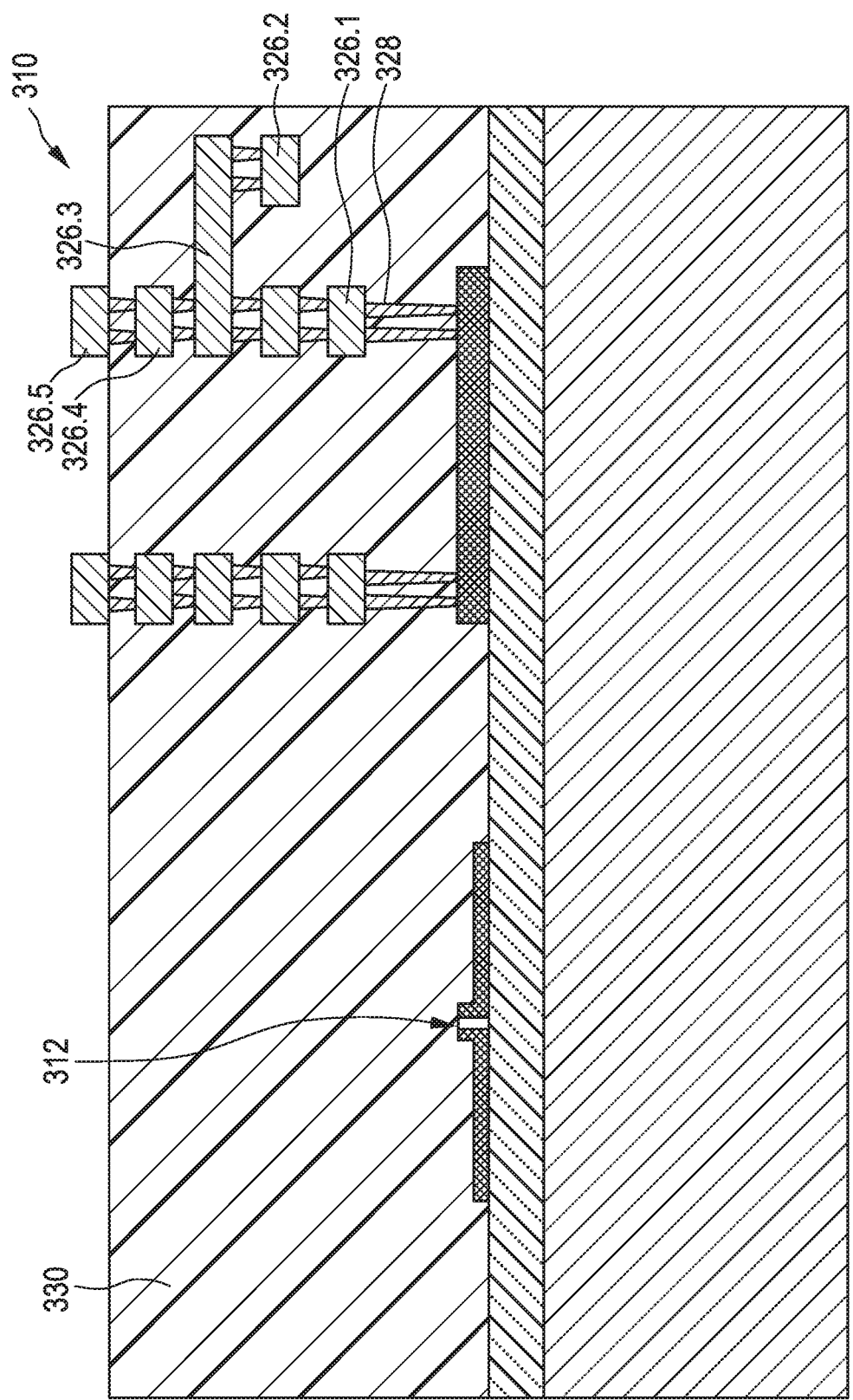

In a later processing step, the result of which is shown in FIG. 4C the electrooptical device 310 has been subjected to a back-end-of-line (BEOL) processing sequence. The back-end-of-line (BEOL) processing includes fabricating a number of metal planes, each comprising conductor tracts 326.1 to 326.5 that are connected by a number of vias, all shown here under the same reference label 328, for transmitting electric signals. The conductor tracks 326.1 to 326.5 are also connected by respective vias 328 to the component 324. The metal planes are embedded in a dielectric matrix 330 material such that an interconnect stack is formed. The dielectric matrix 330 also covers the slot waveguide 312 and the further component 324.

Figure 4D:
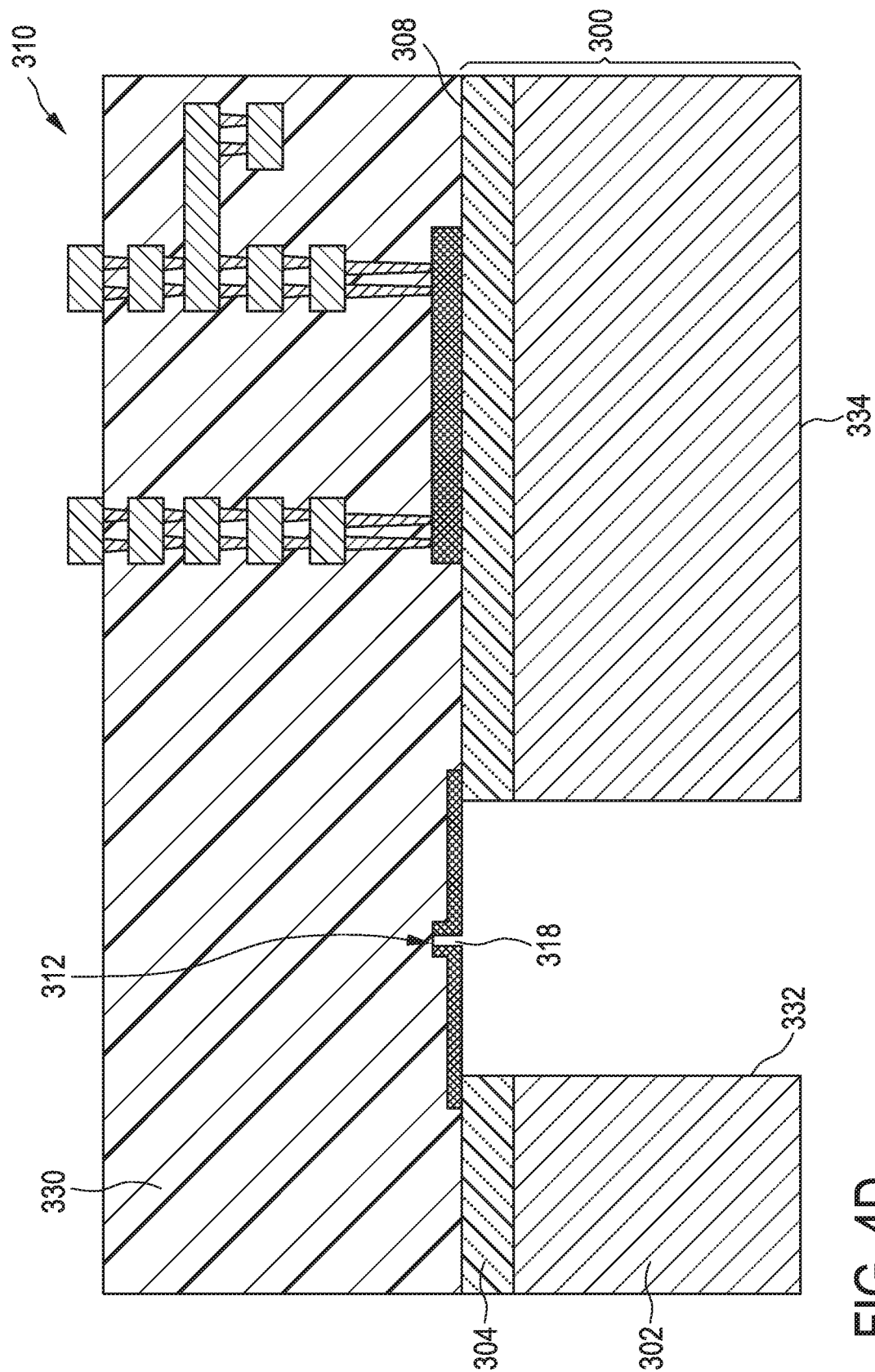

After fabricating the interconnect stack, the successive processing shown in FIG. 4D includes fabricating a cavity 332. The cavity 332 extends from the back side 334 of the SOI substrate 300 up to the back side of the slot waveguide 312 that is the side of the slot waveguide 312 that faces the front side 308 of the SOI substrate 300. That means that the cavity 332 extends through silicon layer 302 and the insulating layer 304. Moreover, the slot 318 that in earlier processing steps was filled with the dielectric matrix material 330 is now also exposed and forms a part of the fabricated cavity 332.

The cavity 332 can be fabricated, e.g., via back side patterning or back side release. Processing techniques that can be applied are, e.g., back-to-front side lithography alignment, deep Si-etch or $SiO_2$ remove, e.g., using anisotropic wet-etching or HF-vapour etch.

Figure 4E:
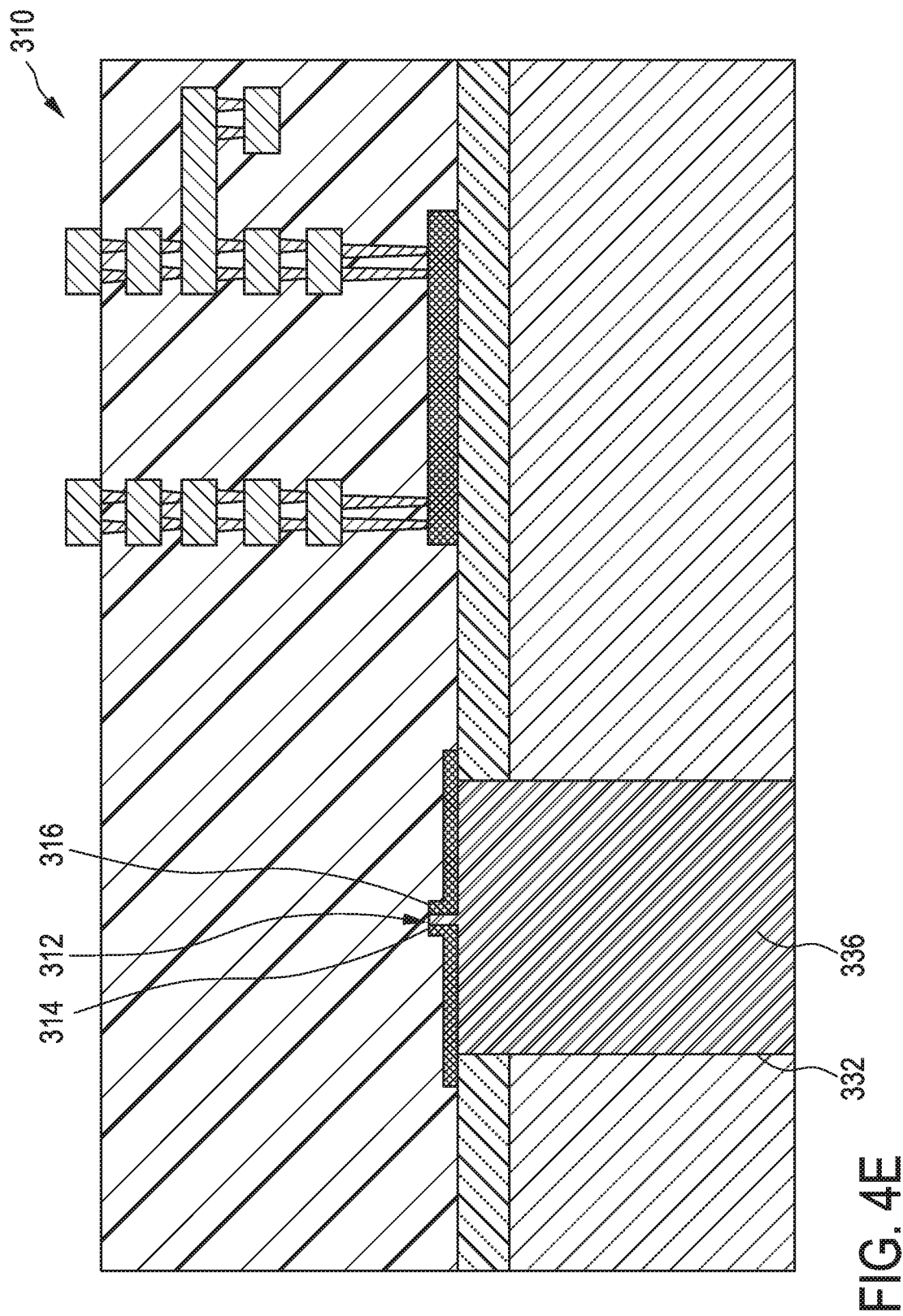

In FIG. 4E the electrooptical device 310 is shown after inserting the non-linear optical material 336 through the cavity 332. By inserting the non-linear optical material 336 through the cavity 332, the slot waveguide 312 is filled with the non-linear optical material 336 such that the active layer is formed between the two silicon rails 314, 316 of the slot waveguide 312. The non-linear optical material 336 is an organic material. Thus, by inserting the non-linear optical material 336 through the cavity 332, a silicon-organic hybrid (SOH) modulator is formed. The non-linear optical material used in the present embodiment is a polymer or amorphous carbon/diamond carbon. Also a mixture of a polymer and amorphous carbon in the form of, e.g., carbon flakes can be applied. Optionally, a mixture of a polymer and nanocrystals of halogenide perovskite, non-functionalized fullerenes or functionalized fullerenes can be applied.

This way, a silicon-organic hybrid (SOH) modulator is integrated into a complete chip design, which was a virtual impossibility in current device fabrication solutions.

The non-linear optical material 336 is inserted, e.g., by gas phase deposition technique, liquid phase deposition technique, spin coating, dip coating, physical vapour deposition (PVD), plasma enhanced CVD (PECVD), chemical vapour deposition (CVD), atomic layer deposition (ALD), metal organic chemical vapour deposition (MOCVD), self-assembly, Langmuir-Blodgett-Technique, spraying, electro-spray, ink-jet printing, or alternative techniques known in the art, in particular for employing soluble organic materials. As an alternative, inorganic materials can be inserted using the abovementioned techniques, too. Other techniques that can be for inserting organic and inorganic materials are physical or chemical vapour phase deposition. Another technique than can be applied is vacuum deposition polymerisation in which polymers are formed during the deposition process under vacuum conditions.

Suitable non-linear optical materials that can form the active layer in other embodiments are, e.g., polydiacetylens, preferably in crystallised form, and preferably aligned with an axis of a one-dimensional conjugated electron system of its polymer chains along the polarisation direction of the electric field vector of the travelling optical wave. Other non-linear optical materials that can be used are conjugated azobenzene polymers. In principle, also short conjugated oligomers and respective chromophores can be used, e.g., beta carotene, oligoparaphnylenevinylene, oligocyanine-dyes, but also more stable ladder type polymers like oligo-rylenes or ladder type polyparaphenylene. Another option is to use composite materials which are composed of a transparent dielectric matrix filled with a suitable concentration of one-dimensional conductive or semiconducting nano-domains, which in some variants advantageously also exhibit a spatial confinement of the electron system in the active layer. Other examples of suitable materials for use in the conductive or semi-conducting nano-domains are gold, silver, tungsten, aluminium, metallic or semiconducting nanowires, also formed of aligned nanodots, which have direct contact to each other. Matrix materials can be dielectric polymers, glass or various dielectric oxides, e.g., silicon dioxide, or other suitable oxides, e.g., hafnium oxide.

In other alternative embodiments, the non-linear optical material is made of an inorganic material. Suitable examples are salts like sulfides, bisphosphonates or nitrates.

Figure 4F:
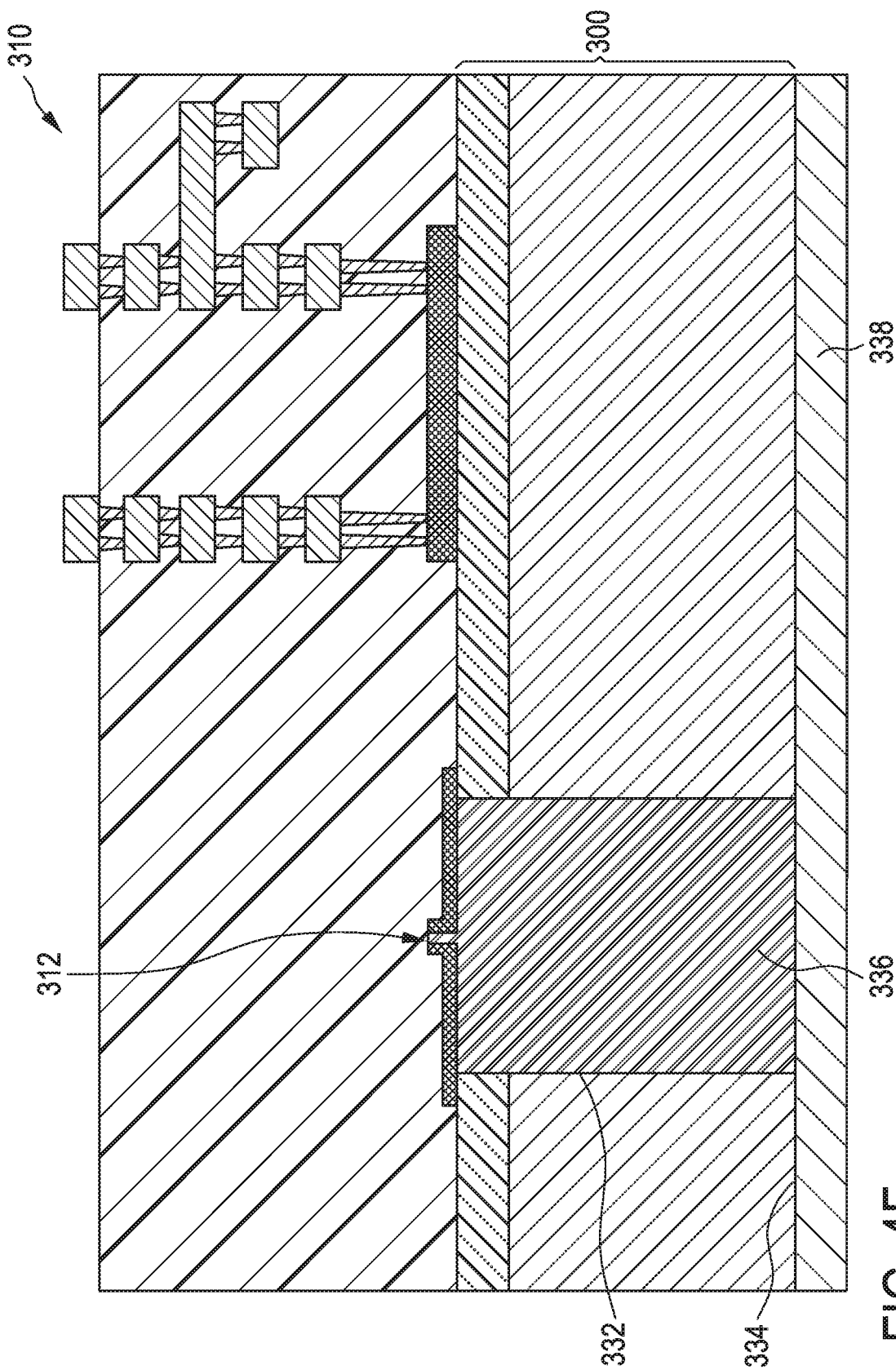

FIG. 4F shows the electrooptical device 310 after fabricating a back side encapsulation 338 for sealing the cavity 332 from an ambient atmosphere on the back side 334 of the silicon-on-insulator substrate 300. By sealing the cavity 332 from an ambient atmosphere the long-term stability of the non-linear optical material 336 is increased. In fact, the performance of the active layer in the slot waveguide 312 is typically strongly influenced by external influences such as humidity, presence of oxygen, UV light and by the ambient temperature. The back side encapsulation 338 protects the non-linear optical material 336 from these influences. The backside encapsulation 338 can also provide a hermetic sealing of the cavity 332.

The back side encapsulation 338 is made by sealing the cavity 332 with a suitable cover layer, which in the present embodiment is a semiconductor cover layer. In particular, the back side encapsulation 338 extends over the whole back side 334 of the SOI substrate 300. The back side encapsulation 338 is a wafer that is bonded to the back side 334 of the silicon layer 300.

As an alternative (not shown), the back side encapsulation 338 can be fabricated by applying a material to the back side 334 of the silicon layer 302, e.g., via chemical vapour deposition.

FIG. 5 shows a block diagram that displays main functional blocks of an electrooptical device 400 for modulating an incoming optical carrier signal, which is indicated as a dashed arrow 401. The electrooptical device 400 comprises an electrooptical modulator 402 that receives a time-dependent electric modulation input signal, represented by a full arrow 403 from a radio-frequency (RF) driver 404. The electrooptical modulator 402 is for instance of the slot waveguide type shown in FIGS. 3 and 4. Via the active layer of this electrooptical modulator 402, in accordance with its non-linear optical response, it is possible to modulate the incoming optical carrier signal 401 that travels through the slot of the electrooptical modulator 402. The modulation is performed in dependence on the applied electric modulation input signal 403 such that an optical output signal represented by a dashed arrow 405 exhibiting an output signal modulation is generated.

In one variant, the electrooptical device 400 of FIG. 5 additionally receives from an optional DC driver 406 a DC offset-voltage 407. In such embodiments, as shown in FIG. 5, a summing component 408 receives the DC offset-voltage and the electric input signal and provides an electric modulation input signal as a sum of the DC offset-voltage and the electric input signal. As a consequence, the time-dependent electric modulation input signal is shifted by the DC offset-voltage to mean value of the voltage that is different as the mean value of the voltage before applying the DC-offset voltage. This allows linearizing an optical carrier signal as will be discussed in the following with respect to FIG. 6.

After modulating the optical carrier signal, an optical output signal comprising an output signal modulation is generated and delivered to a photodiode 410 that converts the optical output signal 405 to an electric signal 411 that is modulated in accordance with the modulation of the optical output signal 405. A transimpedance amplifier 412 serves for amplifying the modulated electric signal 411 and outputting an amplified modulated output signal 413.

The DC driver is not present in other embodiments.

In yet other embodiments, the offset voltage is time-dependent. Using a time-dependent offset voltage increases a bandwidth and allows introducing data encryption for the optical signals. In some embodiments of this kind, the offset voltage comprises a DC offset-voltage component and a superimposed AC offset-voltage component.

FIG. 6 serves for illustrating the modulation.

Figure 6C:
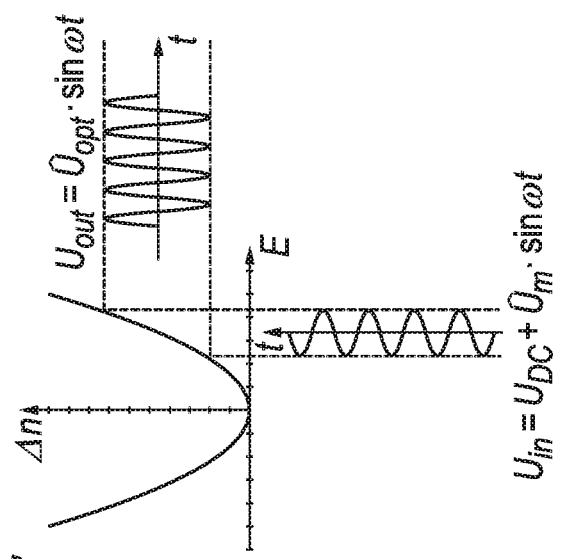
FIG. 6C and 6D a diagram for illustrating a working principle of modulation of an optical carrier signal using an electrical input modulation signal having an input frequency, for generating a modulated optical output signal, which is linearly modulated with respect to the input frequency, using a non-linear optical material exhibiting a quadratic electrooptical effect (QEOE) under a DC-offset voltage.
Figure 6D:
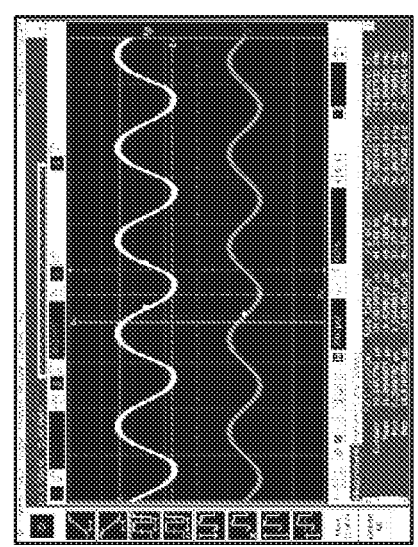
Figure 6A:
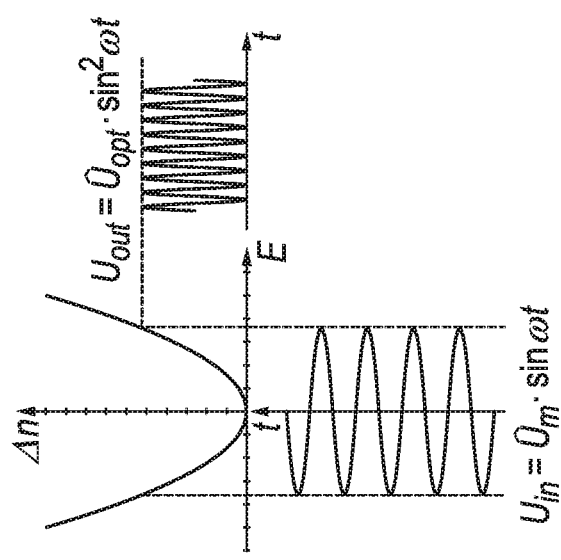
FIG. 6A and 6B a diagram for illustrating a working principle of modulation of an optical carrier signal using an electrical input modulation signal having an input frequency, for generating a modulated optical output signal, which is frequency-doubled with respect to the input frequency, using a non-linear optical material exhibiting a quadratic electrooptical effect (QEOE)
Figure 6B:
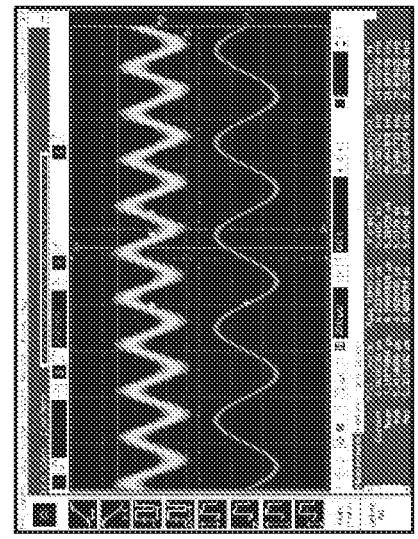

FIGS. 6A and 6B show diagrams for illustrating a working principle of modulation of an optical carrier signal using an electrical input modulation signal having an input frequency, for generating a modulated optical output signal, which is frequency-doubled with respect to the input frequency, using a non-linear optical material exhibiting a quadratic electrooptical effect (QEOE).

In particular, FIG. 6A shows a concept of modulating a time-dependent electric modulation input signal with an electrooptical modulator comprising a quadratic electrooptical effect (QEOE).

The time-dependent electric modulation input signal generates an electrical field in the active layer of the electrooptical modulator in dependence on the electric modulation input signal. If the active layer exhibits a QEOE, the change of the refractive index of the active layer exhibits a quadratic dependency on the time-dependent change of the electric field strength of $U_{in}$. As shown in FIG. 6A, $U_{in}$ oscillates with a sine function around the mean value at zero electric field strength. The modulation results in an electric output signal $U_{out}$ that oscillates with a squared sine function, or in other words with a cosine function with twice the frequency as the $U_{in}$ of the time-dependent electric modulation input signal.

In FIG. 6B an experimental proof of this frequency doubling is shown. The bottom curve presents the electric field strength $U_{in}$ of the time-dependent electric modulation input signal. The curve shown above displays the electric field strength $U_{out}$ of the electric output signal after modulation via the electrooptical modulator exhibiting the QEOE.

FIG. 6C and 6D show diagrams for illustrating a working principle of modulation of an optical carrier signal using an electrical input modulation signal having an input frequency, for generating a modulated optical output signal, which is linearly modulated with respect to the input frequency, using a non-linear optical material exhibiting a quadratic electrooptical effect (QEOE) under a DC-offset voltage.

In FIG. 6C it is shown that the electric output signal $U_{out}$ can be linearized by adding a DC-offset voltage to the time-dependent electric modulation input signal. By adding the DC offset-voltage, the mean value of the electric field strength $U_{in}$ is shifted to an approximately linear branch of the parabolic dependency of the refractive index on the electric field strength. As a result, the dependency of the refractive index on changing electric field strength is approximately linear. This results in a linearization of the electric output signal $U_{out}$ which oscillates at a frequency equal to the frequency of the electric field strength of $U_{in}$ of the time-dependent electric modulation input signal.

In FIG. 6D an experimental proof of the linearization of the electric field strength $U_{out}$ of the electric output signal is shown. As a result of adding a DC-offset-voltage to the time-dependent electric modulation input signal the electric field strength $U_{out}$ of the electric output signal is linearized and has approximately the same frequency as the electric field strength $U_{in}$ of the time-dependent electric modulation input signal. The process of linearizing the electric field strength $U_{out}$ of the electric output signal provides a way of tuning the intensity of the electric output signal. The larger the applied DC offset-voltage, the larger the intensity of the electric output signal.

What is claimed is:

1. An electrooptical device, comprising:
   a semiconductor substrate having a front side and a back side;
   at least one photonic component arranged on the front side of the semiconductor substrate, the photonic component comprising an active layer made of a non-linear optical material; wherein
   at least one cavity extends through the semiconductor substrate and connects the active layer on the front side of the semiconductor substrate with the back side of the semiconductor substrate.

2. The electrooptical device according to claim 1, further comprising a back side encapsulation for sealing the at least one cavity from an ambient atmosphere on the back side of the semiconductor substrate.

3. The electrooptical device according to claim 2, wherein the back side encapsulation is an encapsulation wafer bonded to the semiconductor substrate.

4. The electrooptical device according to claim 1, wherein said non-linear optical material is an organic or inorganic material, which exhibits a second- or third-order non-linear optical effect.

5. The electrooptical device according to claim 1, comprising
   the photonic component on a photonic device plane at a first distance from the front side of the semiconductor substrate, and
   an interconnect stack, which is arranged on the front side of the semiconductor substrate and which comprises conductor tracks on at least two metal planes at respective levels within the interconnect stack having distances from the front side of the semiconductor substrate that are larger than the first distance, wherein
   the conductor tracks on different ones of the metal planes are separated from each other by a respective dielectric material layer, and wherein
   one or more conductive vias connect at least two of the conductor tracks that are arranged on different ones of the metal planes.

6. The electrooptical device according to claim 5 wherein the active layer of the photonic component on the photonic plane is covered by a dielectric material that is different from the non-linear optical material and that is arranged at a smaller distance from the semiconductor surface than a lowest level of the metal planes of the interconnect stack and which is traversed by at least one of the conductive vias.

7. The electrooptical device according to claim 5, wherein said photonic component is an electrooptical modulator, wherein
   the non-linear optical material of the active layer exhibits a non-linear optical response to an electrical field applied to the non-linear optical material and is optically connected to receive an optical carrier signal, and wherein
   the electrooptical modulator comprises field electrodes electrically connected via the interconnect stack to receive a time-dependent electric modulation input signal and arranged to generate an electrical field in the non-linear optical material of the active layer in dependence on the received time-dependent electric modulation input signal, and wherein the non-linear optical material of the active layer, in accordance with its non-linear optical response, is configured to modulate the received optical carrier signal in dependence on the received time-dependent electric modulation input signal so as to generate an optical output signal exhibiting an output signal modulation.

8. The electrooptical device according to claim 7, further comprising a modulation control input for receiving a DC offset-voltage, and a summing component configured to receive the DC offset-voltage and an electric input signal and to provide the time-dependent electric modulation input signal as a sum of the DC offset voltage and the electric input signal.

9. The electrooptical device according to claim 7, wherein the non-linear optical material is arranged between respective inner side faces of field electrodes, which are separated by a distance between 30 nm and 300 nm.

10. The electrooptical device according to claim 7, further comprising
a detector component which is arranged on the photonic device plane and configured to receive the optical output signal from the electrooptical modulator and to provide an electric detector output signal in response thereto, wherein
the interconnect stack comprises an electronic component, which is arranged on one of the metal planes and electrically connected with the detector component.

11. An electrooptical phase shift module, comprising
an optical input configured to receive the optical carrier signal;
an electrooptical device according to claim 7, which is configured to generate the optical output signal exhibiting an output signal modulation by inducing a phase shift in the received optical carrier signal in accordance with the received time-dependent electric modulation input signal;
an optical output configured to provide the optical output signal.

12. An optical arrangement comprising the electrooptical phase shift module of claim 11 in a beam path of a Mach-Zehnder interferometer, a Fabry-Perot resonator, or a ring resonator.

13. A method for fabricating an electrooptical device, comprising:
providing a semiconductor substrate having a front side and a back side;
fabricating at least one photonic component comprising an active layer made of a non-linear optical material on the front side of the semiconductor substrate;
wherein fabricating the at least one photonic component comprises
fabricating a cavity starting from the back side of the semiconductor substrate, and extending the cavity at least to the front side of the semiconductor substrate and up to the photonic component; and
forming the active layer of the photonic component by inserting the non-linear optical material through the cavity from the back side of the semiconductor substrate.

14. The method of claim 13, further comprising, before fabricating the cavity,
fabricating an interconnect stack on the front side of the semiconductor substrate which comprises conductor tracks on at least two metal planes at respective levels within the interconnect stack having distances from the front side of the semiconductor substrate that are larger than a first distance from the front side of the semiconductor substrate, at which the photonic component is arranged.

15. A method according to claim 14, further comprising, after inserting the non-linear optical material through the cavity,
sealing the at least one cavity from an ambient atmosphere by fabricating a back side encapsulation of the cavity on the back side of the semiconductor substrate.

16. A method according to claim 13, further comprising, after inserting the non-linear optical material through the cavity,
sealing the at least one cavity from an ambient atmosphere by fabricating a back side encapsulation of the cavity on the back side of the semiconductor substrate.

* * * * *

UNITED STATES PATENT AND TRADEMARK OFFICE
CERTIFICATE OF CORRECTION

| | | |
|---|---|---|
| PATENT NO. | : 10,833,056 B2 | Page 1 of 1 |
| APPLICATION NO. | : 16/222301 | |
| DATED | : November 10, 2020 | |
| INVENTOR(S) | : Steglich et al. | |

It is certified that error appears in the above-identified patent and that said Letters Patent is hereby corrected as shown below:

On the Title Page

Item [73], please add the name and address of the second assignee as follows:
TECHNISCHE HOCHSCHULE WILDAU
HOCHSCHULRING 1
WILDAU, GERMANY 15745

<p style="text-align:center">Signed and Sealed this<br>Twenty-third Day of November, 2021</p>

<p style="text-align:center">Drew Hirshfeld<br><em>Performing the Functions and Duties of the<br>Under Secretary of Commerce for Intellectual Property and<br>Director of the United States Patent and Trademark Office</em></p>